United States Patent
Clinton

(10) Patent No.: US 6,611,148 B2
(45) Date of Patent: Aug. 26, 2003

(54) APPARATUS FOR THE HIGH VOLTAGE TESTING OF INSULATED CONDUCTORS AND OSCILLATOR CIRCUIT FOR USE WITH SAME

(76) Inventor: Henry H. Clinton, 10 Shore Rd., Clinton, CT (US) 06413

( * ) Notice: Subject to any disclaimer, the term of this patent is extended or adjusted under 35 U.S.C. 154(b) by 0 days.

(21) Appl. No.: 09/911,671

(22) Filed: Jul. 24, 2001

(65) Prior Publication Data

US 2003/0020484 A1 Jan. 30, 2003

(51) Int. Cl.[7] ............................. H01H 31/02; H04B 3/46
(52) U.S. Cl. ........................................ 324/544; 331/114
(58) Field of Search ........................ 324/544, 612–628, 324/76.11–76.77, 691–727; 331/114

(56) References Cited

U.S. PATENT DOCUMENTS

| | | | | |
|---|---|---|---|---|
| 3,642,008 A | * | 2/1972 | Bolduc ........................ 324/601 |
| 3,689,825 A | * | 9/1972 | Mason et al. ............. 331/113 A |
| 4,236,121 A | * | 11/1980 | Senturia ...................... 331/57 |
| 4,310,804 A | * | 1/1982 | Ryon .......................... 331/1 A |
| 4,952,880 A | * | 8/1990 | Clinton ...................... 324/544 |
| 5,056,554 A | * | 10/1991 | White ......................... 137/486 |
| 5,313,143 A | * | 5/1994 | Vila-Masot et al. ...... 331/113 A |
| 6,213,869 B1 | * | 4/2001 | Yu et al. ..................... 438/189 |

\* cited by examiner

Primary Examiner—Christine Oda
Assistant Examiner—Timothy J. Dole
(74) Attorney, Agent, or Firm—McCormick, Paulding & Huber LLP

(57) ABSTRACT

An insulation tester and oscillator circuit for use in same includes a transformer including a primary winding and at least one secondary winding to be coupled across an external load such as an electrode. First and second bipolar junction transistors are connected in a "push-pull" operating mode and coupled to the primary winding of the transformer for producing a high frequency voltage. The primary winding has two ends each respective one of which is coupled to a respective one of the collectors of the first and second bipolar junction transistors. First and second field effect transistors are respectively coupled in parallel with the first and second bipolar junction transistors. An actuator for activating the first and second field effect transistors to respectively conduct substantially synchronously with the first and second bipolar junction transistors shortly after start-up is provided, whereby the majority of current is shunted through the field effect transistors.

15 Claims, 1 Drawing Sheet

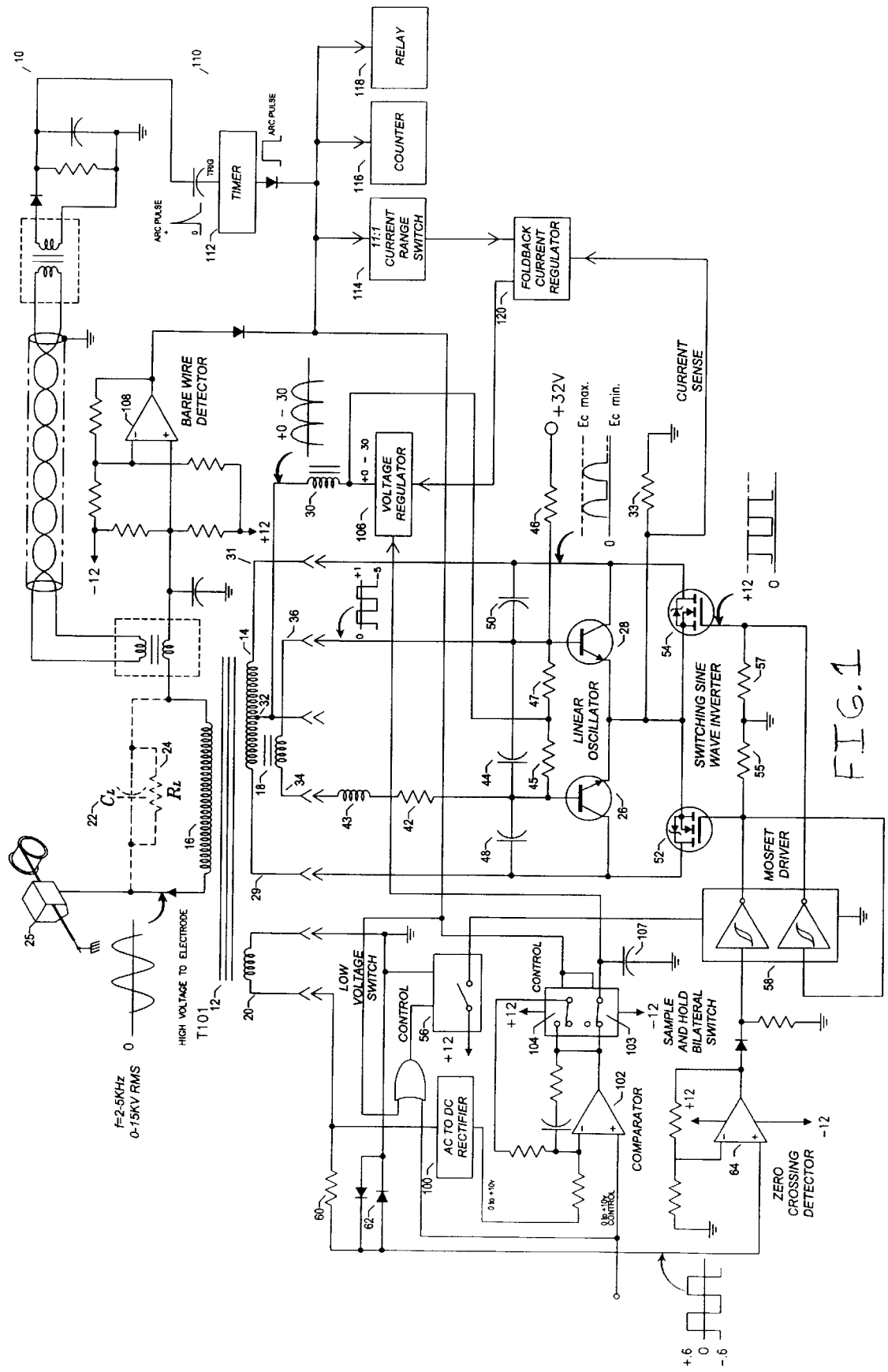

APPARATUS FOR THE HIGH VOLTAGE TESTING OF INSULATED CONDUCTORS AND OSCILLATOR CIRCUIT FOR USE WITH SAME

FIELD OF THE INVENTION

This invention relates generally to an apparatus for testing insulated electrical conductors, and more particularly to a spark tester including a hybrid bipolar-FET power oscillator circuit for improved power efficiency.

BACKGROUND OF THE INVENTION

In the continuous testing of the insulation of an insulated conductor, it is now common practice to employ a high voltage sine wave AC potential at a frequency between about 500 Hz to about 5000 Hz. One method of generating this test potential is by means of a self-excited oscillator operating at the anti-resonant frequency of the high voltage transformer and the capacitance of the product under test to the test electrode. A suitable circuit for this purpose is described in my U.S. Pat. No. 4,952,880, the disclosure of which is herein incorporated by reference.

It is an object of the present invention to provide an improved oscillator circuit for use with an insulation testing apparatus that increases oscillator efficiency so as to increase power delivered to the load while eliminating the need for heat sinks or forced air cooling.

It is a further object of the present invention to provide an insulation testing apparatus that permits the high voltage output to be short-circuited without damage to circuit components and to provide rapid recovery of the high voltage potential to its preset value upon removal of the short-circuit.

SUMMARY OF THE INVENTION

In a first aspect of the present invention an oscillator circuit for use with an insulation testing apparatus includes a transformer having a primary winding and at least one secondary winding. The secondary winding is to be coupled across an external load. At least one bipolar junction transistor is employed in an oscillator loop and is coupled to the primary winding of the transformer for producing high frequency voltage. At least one field effect transistor is coupled in parallel with the bipolar junction transistor. Means for actuating the field effect transistor to conduct with the bipolar junction transistor upon excitation of the primary winding of the transformer is provided, whereby the current conducting through the primary winding is substantially shunted from the bipolar junction transistor to the field effect transistor to significantly reduce power loss otherwise occurring if the current were conducting through the bipolar junction transistor alone.

In a second aspect of the present invention an oscillator circuit for use with an insulation testing apparatus includes a transformer having a primary winding and at least one secondary winding. The secondary winding is to be coupled across an external load. First and second bipolar junction transistors are connected in a "push-pull" operating mode and coupled to the primary winding of the transformer for producing a high frequency voltage. The primary winding has two ends each respective one of which is coupled to a respective one of the collectors of the first and second bipolar junction transistors. First and second field effect transistors are respectively coupled in parallel with the first and second bipolar junction transistors. Further provided is means for actuating the first and second field effect transistors to respectively conduct substantially synchronously with the first and second bipolar junction transistors upon excitation of the primary winding of the transformer, whereby the current conducting through the primary winding is substantially shunted from the bipolar junction transistors to the field effect transistors to significantly reduce power loss otherwise occurring if the current were conducting through the bipolar junction transistors alone.

Preferably, where the oscillator is employed in a push-pull configuration, the transformer includes a second secondary winding, and the actuation means includes a low voltage switch coupled to the second secondary winding for being closed upon excitation of the additional secondary winding, and a driver circuit powered via the low voltage switch for triggering the first and second field effect transistors to respectively conduct substantially synchronously with the first and second bipolar junction transistors.

The driver circuit preferably has first and second digital outputs respectively coupled to the gates of the first and second field effect transistors such that the first output of the driver circuit has an opposite digital state relative to the second output of the driver for actuating the first and second field effect transistors to respectively conduct substantially synchronously with the first and second bipolar junction transistors.

In a third aspect of the present invention, an apparatus for high voltage testing of the insulation of electrical conductors includes an electrode through which an insulated electrical conductor passes. The apparatus further includes an oscillator circuit having a transformer including a primary winding and at least one secondary winding. The secondary winding is to be coupled across the electrode and ground. At least one bipolar junction transistor is employed in an oscillator loop and coupled to the primary winding of the transformer for producing high frequency voltage. At least one field effect transistor is coupled in parallel with the bipolar junction transistor. Further provided is means for actuating the field effect transistor to conduct with the bipolar junction transistor upon excitation of the transformer windings and upon an oscillator signal in the oscillator loop reaching a predetermined voltage, whereby the current conducting through the primary winding is substantially shunted from the bipolar junction transistor to the field effect transistor to significantly reduce power loss otherwise occurring if the current were conducting through the bipolar junction transistor alone.

Preferably, the switching means includes a sample and hold circuit having a switch coupled to a charging capacitor for opening a voltage regulator loop and maintaining via the charged capacitor the supply voltage to the oscillator loop.

An advantage of the present invention is that the resistance and corresponding voltage drop across the field effect transistors is extremely low compared with the voltage drop across the bipolar junction transistors. This results in the shunting of most of the current from the bipolar junction transistors to the field effect transistors such that power losses through the transistors is almost completely eliminated.

Another advantage is that the apparatus embodying the present invention permits the high voltage output to be short-circuited without damage to circuit components and to provide rapid recovery of the high voltage potential to its preset value upon removal of the short-circuit.

These and other advantages of the present invention will become more apparent in the light of the following detailed description and accompanying figures.

BRIEF DESCRIPTION OF THE DRAWINGS

FIG. 1 schematically illustrates an insulation testing apparatus embodying the present invention.

DETAILED DESCRIPTION OF THE PREFERRED EMBODIMENT

Turning to FIG. 1, an insulation testing apparatus embodying the present invention is generally designated by the reference number 10. The apparatus 10 employs high voltage to test the insulation of electrical conductors for faults such as bare wire or pin holes.

The apparatus 10 includes an oscillator circuit having a high voltage transformer 12 with a primary winding 14 and first, second and third secondary windings 16, 18 and 20, respectively. The first secondary winding 16 is a high voltage winding to be coupled to a load having a capacitance represented by 22 and a resistance represented by 24, such that the winding 16 and the load capacitance 22 comprise an anti-resonant tuned circuit. The secondary winding 16 may, for example, be coupled to a high voltage test electrode 25 through which an insulated, grounded conductor moves. However, the secondary winding 16 may be coupled to other types of loads without departing from the scope of the present invention.

The oscillator circuit further includes first and second bipolar junction transistors (BJTs) 26 and 28 arranged in a "push-pull" operating mode such that one transistor is in a fully conductive state while the other is in a cut-off state during one half of the oscillating cycle and with the transistors assuming opposite conductive states during the other half of the oscillating cycle. Although the oscillator circuit is shown in a push-pull configuration, it should be understood that the oscillator circuit may be implemented in single-ended or other types of configurations without departing from the scope of the present invention. The collectors of the transistors 26 and 28 are coupled to respective ends 29 and 31 of the primary winding 14 of the transformer 12. The emitters of the transistors 26 and 28 are coupled to one another and to ground potential via a biasing resistor 33. It will be recognized that a square wave is developed across the collector-to-emitter of each of the first and second transistors 26 and 28. The imposition of a square wave on an antiresonant tuned circuit causes large heat losses in the transistors 26, 28 and in the transformer 12. A sinusoidal waveform rather than a square wave is therefore desired to be impressed across the primary winding 14 of the transformer 12 and an inductor or choke 30 having a constant current characteristic is connected to a center tap 32 of the primary winding to absorb the difference in the two waveforms to produce the desired sinusoidal waveform. The other end of the choke 30 is connected to a DC potential which may be varied from, for example, about 0 volts to about +32 volts. Thus, the oscillator circuit has greatly improved efficiency achieved as a result of not impressing the square wave generated on the antiresonant tuned circuit. Accordingly, employment of the inductor 30 reduces the direct current necessary to supply a given power to the load resistance 24 connected across ends of the first secondary winding 16 of the transformer 12. The second secondary winding 18 of the transformer 12 has ends 34, 36 coupled to the respective bases of the first and second transistors 26, 28 to provide positive feedback to produce oscillation.

A low pass filter such as, for example, an LC filter including a current limiting resistor 42, an inductor 43, and a capacitor 44 which is connected between the bases of the transistors 26 and 28 respectively, is used to prevent radio frequency parasitic oscillations. Also connected between the bases are forward biasing resistors 45 and 47. The parasitic oscillations may be caused by transformer leakage reactance or by mutual coupling between the various circuit components such as those that occur when a long connecting cable is used between the transistors 26 and 28 and the transformer 12. Stability of the oscillator circuit may be maintained when distances up to several hundred feet are introduced between the high voltage transformer and the oscillator circuit components.

When a DC voltage is applied to the inductor 30, the transistors 26 and 28 are forward biased by a resistor 46 having one end coupled to a DC voltage of, for example, 32 volts, and another end coupled to the base of the transistor 28. At the same time, a collector voltage is applied to the transistors 26 and 28 through the inductor 30 and the primary winding 14. The second secondary winding 18 is connected to the bases of the transistors 26 and 28 so as to increase current flow in one of the transistors and decrease current flow in the other of the transistors as soon as current flow in the primary winding 14 induces voltage in the second secondary winding 18.

The first secondary winding 16 and the load capacitance 22 comprise a high Q anti-resonant circuit in the frequency range of, for example, about 2 to about 5 kHz, and any primary current change will cause an oscillatory voltage in all windings of the transformer 12 at some frequency in this range. The second secondary winding 18 applies additional base current to whichever of the transistors 26 and 28 is conducting most and cuts off the other transistor until the former transistor is in full conduction. The action of the anti-resonant transformer 12 then reverses the roles of the transistors 26 and 28, and the transistors continue to alternate between cutoff and full conduction. The inductor 30 permits the anti-resonant transformer 12 to control the frequency and waveform of the resultant continuous oscillation. Capacitors 48 and 50 coupled between the base and the collector of the BJTs 26 and 28, respectively, prevent spurious oscillation at high frequencies.

Power field effect transistors (FETs), such as MOSFETs 52 and 54, are coupled across the oscillator bipolar junction transistors 26 and 28. As shown in FIG. 1, the sources of the first and second FETs 52 and 54 are coupled to each other and to each of the emitters of the first and second BJTs 26 and 28. The drains of the first and second FETs 52 and 54 are respectively coupled to the collectors of the first and second BJTs 26 and 28. The gates of the FETs 52 and 54 are coupled to ground potential via biasing resistors 55 and 57, respectively. As the linear oscillator starts to oscillate the BJTs are in a conductive state and the FETs are in a non-conductive state. Further, a sine wave voltage is induced in the third secondary winding 20, closing a low voltage switch 56 coupled across the winding 20 when an oscillation signal in the oscillator loop reaches a predetermined voltage so as to apply operating power to FET driver 58. Simultaneously, the sine wave voltage is clipped by a resistor 60 and a crossed diodes 62, each coupled to opposite ends of the winding 20, and applied through a buffer 64 to the FET driver 58, causing the gates of the first and second FET transistors 52 and 54 to be driven alternately positive and, in turn, causing the FETs 52 and 54 respectively to conduct in synchronism with that of the conduction of the first and second bipolar junction transistors 26 and 28.

The drain-to-source resistance and corresponding voltage drops of the first and second field effect transistors 52 and 54 are extremely low—even at high drain currents—compared to that of the collector-to-emitter resistance and corresponding voltage drop of the first and second bipolar junction transistors 26 and 28. As a result, virtually all of the current to the primary winding 14 of the transformer 12 is carried by the first and second field effect transistors 52 and 54, having been substantially shunted away from the first and second bipolar junction transistors 26 and 28. Power losses in both the first and second field effect transistors 52 and 54 and the first and second bipolar junction transistors 26 and 28 are almost completely eliminated. Consequently, more power is delivered to the high voltage load, and overall efficiency is significantly increased as compared to conduction through the first and second bipolar junction transistors 26 and 28 alone.

It is theoretically possible to employ field effect transistors alone in a linear mode to start oscillation. From a practical point of view, however, it is very difficult to bias the transistors in the linear mode and still use it as a low-loss high current switch. The center of the normal operating current range for a typical small power field effect transistor could be 15 amperes or more with an operating gate bias of +6 volts. A change in bias of 0.4 volts would change the collector current by 5 amperes. This is suitable for the described purpose, but linear operation could not result without introducing large resistance values in the emitter-drain circuit or using elaborate biasing circuits.

The bipolar junction transistors are easily biased in their linear regions to start oscillation efficiently. This allows the power field effect transistors to take over the load as soon as oscillations reach a predetermined oscillator output voltage.

Continuing with reference to FIG. 1, the apparatus 10 further includes a precision rectifier 100 using a voltage from the secondary winding 20 of the transformer 12 to generate a 0 to +10 VDC which is directly proportional to the 0 to 15 kV RMS high voltage at the test electrode 25. This DC is connected to one input of a voltage comparator 102. The other input of the comparator 102 connects through a sample and hold circuit, comprising switch 103 and capacitor 107, to a voltage regulator 106 which supplies a 0 to +32 VDC to the oscillator inverter circuit, thereby controlling the amplitude of the high voltage.

The voltage regulator 106 ensures that the output of the precision rectifier 100 is close to the control voltage so as to cause the electrode AC test potential to vary in direct proportion to the control voltage. The sample and hold circuit, and switch 104 serving as a comparator voltage stabilizer, function only when a pinhole or bare wire interval passes through the test electrode 25. During the time period required for the fault to complete its passage through the electrode 25, the sample and hold circuit 103, 107 opens the regulator loop, but maintains the DC regulator output voltage at its pre-fault level by means employing the charged capacitor 107 to maintain a supply voltage to the voltage regulator. At the conclusion of the event, the sample and hold circuit 103, 107 and the voltage regulator 106 revert to non-fault operation without causing the high voltage either to rise too slowly or to overshoot its proper value. This characteristic is important to ensure detection of closely spaced faults and to avoid the application of excessive test potentials.

A conventional bare wire detector 108 responds to DC current flow from the conductor under test to the electrode 25 by superimposing a low voltage DC on the high voltage, and then detecting any direct current flow to ground. This produces a bare wire indication for any ohmic contact between the electrode and product conductor, and is independent of high voltage test conditions.

The apparatus 10 may include a fault indicating circuit 110, including a timer circuit 112, counter 116, and relay 118. The DC current drawn by the oscillator circuit varies in accordance with the power loss in the load presented to the high voltage electrode 25 by the product under test. The current is measured by a DC current limiter 120 and, should the current exceed a preset level, the limiter output acts on the voltage regulator 106 to reduce the DC voltage supplied to the oscillator circuit, thus maintaining current at the preset level. The fault indicating circuit 110 and the bare wire detector 108 also operate a current range switch 114 so as to reduce the preset current level of current limiter 120 in the event any product fault passes through the electrode 25.

The preset level of current is automatically reduced, for example, by a factor of eleven when a bare or pinhole fault event occurs. This is accomplished by switching the range of the current range switch 114 coupled to the current limiter 120. This reduces the current in an arc occurring within the high voltage electrode 25, and also reduces the shock hazard for operating personnel. Whenever the low voltage detector operates, drive to the field effect transistors 52 and 54 is removed. Oscillation is then maintained by the bipolar junction transistors 26 and 28, which also restart oscillation immediately after a bare wire event.

The abrupt transient changes in the current of the high voltage transformer secondary 16 that occurs when a pinhole fault occurs are used to trigger the timer 112 which generates a series of pulses as a pinhole fault passes through the electrode 25.

Although the invention has been shown and described in a preferred embodiment, it should be understood that numerous modifications can be made without departing from the spirit and scope of the present invention. Accordingly, the present invention has been shown and described by way of illustration rather than limitation.

What is claimed is:

1. An oscillator circuit comprising:
   a transformer including a primary winding and at least one secondary winding, the secondary winding to be coupled across an external load;
   first and second bipolar junction transistors connected in a "push-pull" operating mode in an oscillator loop and coupled to the primary winding of the transformer for producing a high frequency voltage, the primary winding having two ends each respective one of which is coupled to a respective one of the collectors of the first and second bipolar junction transistors;
   first and second field effect transistors respectively coupled in parallel with the first and second bipolar junction transistors; and
   means for actuating the first and second field effect transistors to respectively conduct substantially synchronously with the first and second bipolar junction transistors upon excitation of the transformer windings and upon an oscillator signal in the oscillator loop reaching a predetermined voltage, whereby the current conducting through the primary winding is substantially shunted from the bipolar junction transistors to the field effect transistors to significantly reduce power loss otherwise occurring if the current were conducting through the bipolar junction transistors alone.

2. An oscillator circuit as defined in claim 1, wherein the first and second field effect transistors are MOSFETs.

3. An oscillator circuit as defined in claim 1, wherein the first and second field effect transistors are IGFETs.

4. An oscillator circuit as defined in claim 1, wherein the transformer includes an additional secondary winding, and wherein the actuation means includes a low voltage switch coupled to the additional secondary winding for being closed upon excitation of the additional secondary winding, and a driver circuit powered via the low voltage switch for triggering the first and second field effect transistors to respectively conduct substantially synchronously with the first and second bipolar junction transistors.

5. An oscillator circuit as defined in claim 4, further including a buffer circuit interposed between the additional secondary winding and the driver circuit.

6. An oscillator circuit as defined in claim 5, wherein the driver circuit has first and second digital outputs respectively coupled to the gates of the first and second field effect transistors, the first output of the driver circuit having an opposite digital state relative to the second output of the driver.

7. An oscillator circuit as defined in claim 6, wherein the buffer circuit is configured as a zero crossing detector for triggering upon each zero crossing the first and second outputs of the driver circuit each to change to the opposite digital state.

8. An oscillator circuit as defined in claim 1, wherein the transformer includes an additional secondary winding, and further including a low pass filter interposed between the additional secondary winding and the bases of the first and second bipolar junction transistors.

9. An oscillator circuit as defined in claim 8, wherein the low pass filter is an LC filter.

10. An oscillator circuit comprising:
   a transformer including a primary winding and at least one secondary winding, the secondary winding to be coupled across an external load;
   at least one bipolar junction transistor employed in an oscillator loop and coupled to the primary winding of the transformer for producing high frequency voltage;
   at least one field effect transistor coupled in parallel with the bipolar junction transistor; and
   means for actuating the field effect transistor to conduct with the bipolar junction transistor upon excitation of the transformer windings and upon an oscillator signal in the oscillator loop reaching a predetermined voltage, whereby the current conducting through the primary winding is substantially shunted from the bipolar junction transistor to the field effect transistor to significantly reduce power loss otherwise occurring if the current were conducting through the bipolar junction transistor alone.

11. An oscillator circuit as defined in claim 10, wherein the at least one field effect transistor is a MOSFET.

12. An oscillator circuit as defined in claim 10, wherein the at least one field effect transistor is an IGFET.

13. An oscillator circuit as defined in claim 10, wherein the transformer includes an additional secondary winding, and wherein the actuation means includes a low voltage switch coupled to the additional secondary winding for being closed upon excitation of the additional secondary winding, and a driver circuit powered via the low voltage switch for triggering the field effect transistor to conduct with the bipolar junction transistor.

14. An oscillator circuit as defined in claim 13, further including a buffer circuit interposed between the additional secondary winding and the driver circuit.

15. An oscillator circuit as defined in claim 13, wherein the driver circuit has a digital output coupled to the gate of the field effect transistor.

* * * * *